United States Patent
Lee

(10) Patent No.: US 10,237,969 B2
(45) Date of Patent: Mar. 19, 2019

(54) ELECTROMAGNETIC BANDGAP STRUCTURE AND METHOD FOR MANUFACTURING THE SAME

(71) Applicant: ELECTRONICS AND TELECOMMUNICATIONS RESEARCH INSTITUTE, Daejeon (KR)

(72) Inventor: Hongyeal Lee, Sejong-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 15/453,607

(22) Filed: Mar. 8, 2017

(65) Prior Publication Data
US 2018/0070441 A1    Mar. 8, 2018

(30) Foreign Application Priority Data

Sep. 6, 2016    (KR) ........................ 10-2016-0114330

(51) Int. Cl.
| | |
|---|---|
| *H05K 1/00* | (2006.01) |
| *H05K 1/02* | (2006.01) |
| *H05K 1/11* | (2006.01) |
| *H05K 3/40* | (2006.01) |

(Continued)

(52) U.S. Cl.
CPC .......... *H05K 1/0236* (2013.01); *H05K 1/115* (2013.01); *H05K 3/4038* (2013.01); *H05K 3/4644* (2013.01); *H05K 1/165* (2013.01); *H05K 2201/09263* (2013.01)

(58) Field of Classification Search
CPC ... H05K 1/00; H05K 1/02; H05K 1/11; H05K 1/16; H05K 1/18; H01P 1/00; H01P 1/20; H01P 1/203; H01R 12/04

USPC ........ 174/250, 251, 255, 260–262, 264–266, 174/350, 360, 376, 384, 386; 333/12, 333/167, 185, 202, 204, 212, 247; 361/762, 777, 800, 818
See application file for complete search history.

(56) References Cited

U.S. PATENT DOCUMENTS

| | | | | |
|---|---|---|---|---|
| 5,690,781 | A | * | 11/1997 | Yoshida ............ H01J 37/32458 118/723 I |
| 6,522,217 | B1 | * | 2/2003 | Shen ................... H01P 1/20381 333/99 S |
| 8,044,862 | B2 | | 10/2011 | Sim et al. |

(Continued)

FOREIGN PATENT DOCUMENTS

| | | |
|---|---|---|
| KR | 10-0848848 B1 | 7/2008 |
| KR | 10-2010-0048432 A | 5/2010 |

(Continued)

*Primary Examiner* — Xiaoliang Chen
(74) *Attorney, Agent, or Firm* — NSIP Law

(57) ABSTRACT

Disclosed are an electromagnetic bandgap structure and a method for manufacturing the same. The electromagnetic bandgap structure includes a ground layer, a middle layer configured to include one or more patches, and to face the ground layer with a first dielectric layer interposed between the middle layer and the ground layer, wherein the first dielectric layer is stacked on a top of the ground layer, and a power layer configured to face the middle layer with a second dielectric layer interposed between the power layer and the middle layer, wherein the second dielectric layer is stacked on a top of the patches, wherein the patches and the power layer are electrically connected to each other through a via.

17 Claims, 5 Drawing Sheets

(51) Int. Cl.
*H05K 3/46* (2006.01)
*H05K 1/16* (2006.01)

(56) References Cited

U.S. PATENT DOCUMENTS

| | | | |
|---|---|---|---|
| 8,183,468 B2 | 5/2012 | Kim et al. | |
| 9,231,291 B2 | 1/2016 | Kim et al. | |
| 9,634,369 B2* | 4/2017 | Toyao | H01P 7/082 |
| 9,634,370 B2* | 4/2017 | Toyao | H01P 3/026 |
| 2002/0021255 A1* | 2/2002 | Zhang | H01Q 13/10 |
| | | | 343/770 |
| 2004/0027308 A1* | 2/2004 | Lynch | H01Q 9/27 |
| | | | 343/895 |
| 2005/0029632 A1* | 2/2005 | McKinzie, III | H01P 1/16 |
| | | | 257/665 |
| 2005/0205292 A1* | 9/2005 | Rogers | H05K 1/0231 |
| | | | 174/255 |
| 2007/0289771 A1* | 12/2007 | Osaka | H01L 23/66 |
| | | | 174/250 |
| 2008/0185179 A1* | 8/2008 | Kim | H05K 1/0236 |
| | | | 174/265 |
| 2008/0264685 A1* | 10/2008 | Park | H05K 1/0236 |
| | | | 174/262 |
| 2008/0266018 A1* | 10/2008 | Han | H01P 1/2005 |
| | | | 333/12 |
| 2008/0266026 A1* | 10/2008 | Han | H01P 1/2005 |
| | | | 333/185 |
| 2008/0314630 A1* | 12/2008 | Kim | H01P 1/2005 |
| | | | 174/261 |
| 2008/0314634 A1* | 12/2008 | Kim | H05K 1/0236 |
| | | | 174/264 |
| 2008/0314635 A1* | 12/2008 | Kim | H01P 1/2005 |
| | | | 174/264 |
| 2009/0015354 A1* | 1/2009 | Kim | H01P 1/2005 |
| | | | 333/247 |
| 2009/0071603 A1* | 3/2009 | Koo | B32B 37/02 |
| | | | 156/277 |
| 2009/0071709 A1* | 3/2009 | Han | H05K 1/0236 |
| | | | 174/360 |
| 2009/0085691 A1* | 4/2009 | Kim | H05K 1/0231 |
| | | | 333/185 |
| 2009/0086451 A1* | 4/2009 | Kim | H05K 1/0218 |
| | | | 361/762 |
| 2009/0236141 A1* | 9/2009 | Kim | H01P 1/2005 |
| | | | 174/360 |
| 2009/0315648 A1* | 12/2009 | Toyao | H01P 1/2005 |
| | | | 333/238 |
| 2009/0322450 A1* | 12/2009 | Kim | H01P 1/2005 |
| | | | 333/204 |
| 2010/0085128 A1* | 4/2010 | Cho | H01P 1/2005 |
| | | | 333/12 |
| 2010/0108373 A1* | 5/2010 | Park | H01L 23/49822 |
| | | | 174/376 |
| 2010/0127790 A1* | 5/2010 | Bong | H05K 1/0236 |
| | | | 333/12 |
| 2010/0132996 A1* | 6/2010 | Han | H05K 1/0236 |
| | | | 174/262 |
| 2010/0134212 A1* | 6/2010 | Kim | H01P 1/20 |
| | | | 333/202 |
| 2010/0134213 A1* | 6/2010 | Kim | H01P 1/2005 |
| | | | 333/202 |
| 2010/0156523 A1* | 6/2010 | Kwon | H05K 1/0236 |
| | | | 327/551 |
| 2010/0212951 A1* | 8/2010 | Kim | H05K 1/0236 |
| | | | 174/386 |
| 2010/0214178 A1* | 8/2010 | Toyao | H01P 1/2005 |
| | | | 343/702 |
| 2010/0265159 A1* | 10/2010 | Ando | H01Q 9/0421 |
| | | | 343/913 |
| 2010/0328178 A1* | 12/2010 | Cho | H01Q 1/2283 |
| | | | 343/841 |
| 2011/0012697 A1* | 1/2011 | Takemura | H01P 1/2005 |
| | | | 333/212 |
| 2011/0026234 A1* | 2/2011 | Kim | H05K 1/0236 |
| | | | 361/800 |
| 2011/0163823 A1* | 7/2011 | Park | H05K 1/0236 |
| | | | 333/12 |
| 2011/0299264 A1* | 12/2011 | Kim | H05K 1/0236 |
| | | | 361/818 |
| 2013/0003333 A1* | 1/2013 | Toyao | H05K 1/0236 |
| | | | 361/777 |
| 2013/0057362 A1* | 3/2013 | Wu | H05K 1/0236 |
| | | | 333/204 |
| 2013/0068515 A1* | 3/2013 | Toyao | H05K 1/0236 |
| | | | 174/260 |
| 2013/0126227 A1* | 5/2013 | Ishida | H05K 1/0236 |
| | | | 174/350 |
| 2013/0143445 A1* | 6/2013 | Kawakami | H01L 23/49822 |
| | | | 439/626 |
| 2014/0225681 A1* | 8/2014 | Kim | H01P 11/007 |
| | | | 333/167 |
| 2014/0291007 A1* | 10/2014 | Tang | H05K 1/0236 |
| | | | 174/266 |
| 2015/0041185 A1* | 2/2015 | Chiu | H05K 1/0236 |
| | | | 174/251 |

FOREIGN PATENT DOCUMENTS

| | | |
|---|---|---|
| KR | 10-2011-0052363 A | 5/2011 |
| WO | WO 99/50929 | 10/1999 |

* cited by examiner

ELECTROMAGNETIC BANDGAP STRUCTURE AND METHOD FOR MANUFACTURING THE SAME

CROSS REFERENCE TO RELATED APPLICATION

This application claims the benefit of Korean Patent Application No. 10-2016-0114330, filed Sep. 6, 2016, which is hereby incorporated by reference in its entirety into this application.

BACKGROUND OF THE INVENTION

1. Technical Field

The present invention relates generally to an Electromagnetic Bandgap (EBG) structure and, more particularly, to an electromagnetic bandgap structure which blocks the transmission of broadband noise present between a power plane and a ground plane on a printed circuit board on which mixed signals are used together.

2. Description of the Related Art

Recently, the current trend of data communication equipment including multimedia devices is towards the implementation of small size and light weight and the integration of circuits as handheld functions are required. For this trend, designs for the small-size implementation and integration of embedded circuits have been realized, and digital circuits and analog/Radio Frequency (RF) circuits of data communication equipment are implemented on a single board.

As modules having various data communication functions are integrated into a single device, various frequency bands are simultaneously activated. Further, in order to rapidly provide a large amount of information, a carrier frequency band has increased to a band from several GHz to several tens of GHz so as to implement broadband communication. Digital circuits operating in such a high frequency band cause simultaneous switching noise (SSN) extending to a broadband range.

Multimedia devices, which use mixed signals, exploit a power-ground plane shared by digital circuits and RF/analog circuits. The power-ground plane acts as a single parallel plate waveguide (PPW), and forms a transverse electromagnetic (TEM) resonance mode, which is a PPW mode. In this case, the frequency of the TEM resonance mode increases up to several GHz due to the small-size implementation of circuits.

Therefore, SSN occurring in a digital circuit consequently leads to the power-ground plane through a via or the like connected to the power-ground plane, and moves along the power-ground plane due to the TEM resonance mode formed on the power-ground plane, so that SSN is propagated to other circuits or is radiated from the end of a printed circuit board, thus negatively influencing RF circuits.

For these reasons, power quality is degraded or a power margin is decreased due to the malfunction of analog circuits or the like. Further, such SSN causes problems in that it deteriorates signal quality by distorting the waveform of digital signals and also deteriorates communication performance due to the noise induced in RF circuits.

In order to cancel broadband noise, a broadband noise-cancelling device for cancelling noise ranging from a MHz band to a GHz band is required. Generally, a decoupling capacitor is used between a power plane and a ground plane to eliminate parasitic inductance in order to cancel noise ranging up to several hundreds of MHz.

However, a problem may arise in that a decoupling capacitor must be populated on a PCB and costs are increased and in that, when a frequency is increased, inherent parasitic inductance of the decoupling capacitor causes another parallel resonant frequency. Further, there is a disadvantage in that noise having a GHz frequency component, which is problematic in a fast digital system, cannot be suppressed.

In order to reduce the parasitic inductance of a decoupling capacitor, there is a method for suppressing noise in such a way as to increase capacitance by using a thin dielectric substrate having a high dielectric constant between a power plane and a ground plane and then increase the impedance between the power plane and the ground plane. However, the method for suppressing noise using the dielectric substrate is of limited usefulness due to the problem of requiring an additional manufacturing process and thus incurring additional expenses.

Recently, methods for applying an electromagnetic bandgap (EBG) structure, which is developed to suppress surface current in an RF circuit, have been mainly used. However, in the case of a typical EBG structure, the size of the EBG structure must be increased so as to suppress simultaneous switching noise (SSN) in a low frequency band. However, since the sizes of multimedia devices are reduced, the size of a PCB is also reduced, and thus there is a limitation on the extent to which the size of an EBG structure can be increased. In practice, the size of an EBG structure is decreased instead, thus resulting in an increase in the resonant frequency occurring between a power plane and a ground plane.

Therefore, there is required the development of technology related to a broadband resonance suppression EBG structure, which broadens a suppression band by decreasing a resonant frequency occurring in a range from several hundreds of MHz to several GHz to a lower frequency band and by increasing a resonant frequency occurring in a range from several GHz to several tens of GHz to a higher frequency band. In connection with this, Korean Patent No. 10-0848848 (Date of Publication: Jul. 28, 2008) discloses a technology related to "Electromagnetic Bandgap Structure, Printed Circuit Board Comprising This and Method thereof."

SUMMARY OF THE INVENTION

Accordingly, the present invention has been made keeping in mind the above problems occurring in the prior art, and an object of the present invention is to provide an electromagnetic bandgap structure, which satisfies the characteristics of a low resonance suppression start frequency and broadband resonance suppression so as to suppress broadband simultaneous switching noise on a power plane and a ground plane.

Another object of the present invention is to implement a system, in which a digital signal, an analog signal, and an RF signal coexist, as a small-sized system.

A further object of the present invention is to stably operate a system by cancelling power-ground noise in a broadband range.

Yet another object of the present invention is to provide an electromagnetic bandgap structure, which can be applied to a multimedia device in which broadband SSN occurs by overcoming the limitation of a conventional mushroom-like electromagnetic bandgap structure, the noise cancellation frequency band of which is narrow.

In accordance with an aspect of the present invention to accomplish the above objects, there is provided an electromagnetic bandgap structure, including a ground layer, a middle layer configured to include one or more patches, and to face the ground layer with a first dielectric layer interposed between the middle layer and the ground layer, wherein the first dielectric layer is stacked on a top of the ground layer, and a power layer configured to face the middle layer with a second dielectric layer interposed between the power layer and the middle layer, wherein the second dielectric layer is stacked on a top of the patches, wherein the patches and the power layer are electrically connected to each other through a via.

The power layer may be formed in a shape in which multiple fan-shaped regions are connected to each other.

Each of the multiple fan-shaped regions of the power layer may have a meandering structure.

The multiple fan-shaped regions may be configured such that a location of the via is a center of a circle corresponding to the multiple fan-shaped regions.

The multiple fan-shaped regions may be connected to each other at the center of the circle corresponding to the multiple fan-shaped regions.

The via may be configured to connect the one or more patches to the power layer in a vertical direction.

The patches may be each formed in a shape of a rectangle, and a center of the patches may correspond to a location of the via.

The power layer may be formed such that four fan-shaped regions are connected to each other at a center of a circle corresponding to the fan-shaped regions.

Each of the fan-shaped regions may be arranged such that a central angle thereof faces a direction corresponding to a vertex of each patch.

In accordance with another aspect of the present invention to accomplish the above objects, there is provided a Printed Circuit Board (PCB) including an electromagnetic bandgap structure, including a ground layer, a middle layer configured to include one or more patches, and to face the ground layer with a first dielectric layer interposed between the middle layer and the ground layer, wherein the first dielectric layer is stacked on a top of the ground layer, and a power layer configured to face the middle layer with a second dielectric layer interposed between the power layer and the middle layer, wherein the second dielectric layer is stacked on a top of the patches, wherein the patches and the power layer are electrically connected to each other through a via.

In accordance with a further aspect of the present invention to accomplish the above objects, there is provided a method for manufacturing an electromagnetic bandgap structure, including forming a ground layer, forming a middle layer including one or more patches such that the middle layer faces the ground layer with a first dielectric layer interposed between the middle layer and the ground layer, wherein the first dielectric layer is stacked on a top of the ground layer, forming a power layer such that the power layer faces the middle layer with a second dielectric layer interposed between the power layer and the middle layer, wherein the second dielectric layer is stacked on a top of the patches, and forming a via for electrically connecting the patches to the power layer.

The power layer may be formed in a shape in which multiple fan-shaped regions are connected to each other.

Each of the multiple fan-shaped regions of the power layer may have a meandering structure.

The multiple fan-shaped regions may be configured such that a location of the via is a center of a circle corresponding to the multiple fan-shaped regions.

The multiple fan-shaped regions may be connected to each other at the center of the circle corresponding to the multiple fan-shaped regions.

The via may be configured to connect the one or more patches to the power layer in a vertical direction.

The patches may be each formed in a shape of a rectangle, and a center of the patches may correspond to a location of the via.

The power layer may be formed such that four fan-shaped regions are connected to each other at a center of a circle corresponding to the fan-shaped regions.

Each of the fan-shaped regions may be arranged such that a central angle thereof faces a direction corresponding to a vertex of each patch.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
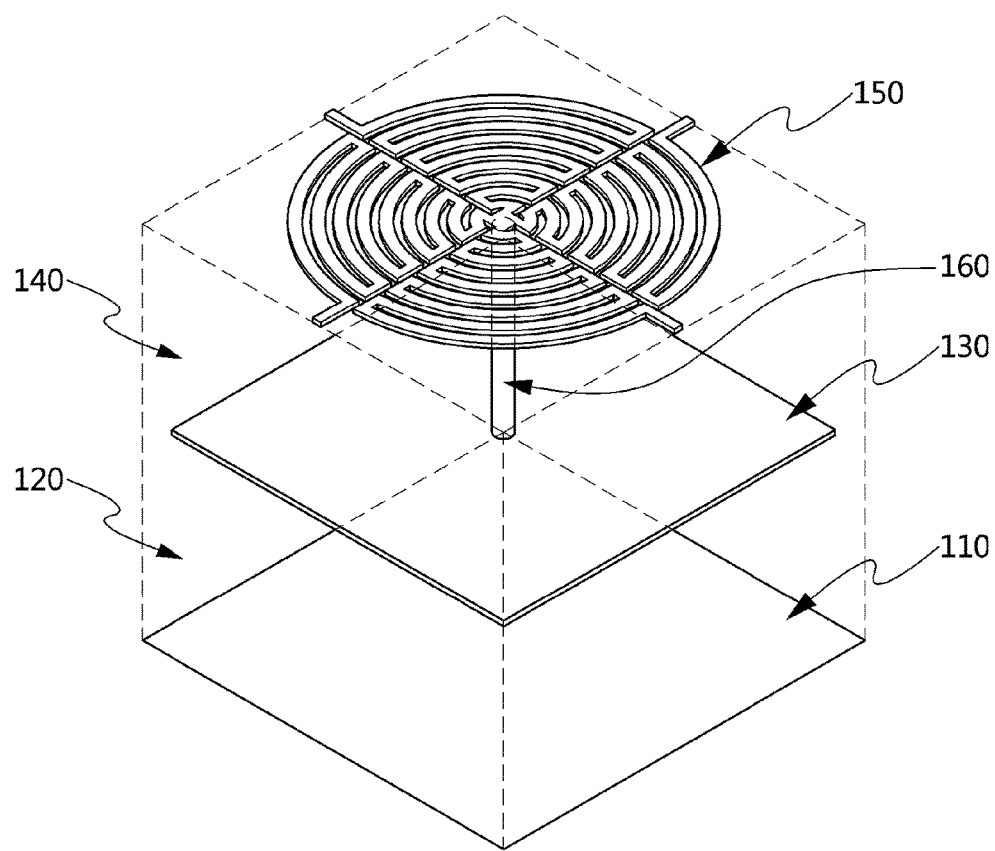
FIG. 1 is a view showing the configuration of an electromagnetic bandgap structure according to an embodiment of the present invention.

The present invention may be variously changed and may have various embodiments, and specific embodiments will be described in detail below with reference to the attached drawings.

However, it should be understood that those embodiments are not intended to limit the present invention to specific disclosure forms and they include all changes, equivalents or modifications included in the spirit and scope of the present invention.

The terms used in the present specification are merely used to describe specific embodiments and are not intended to limit the present invention. A singular expression includes a plural expression unless a description to the contrary is specifically pointed out in context. In the present specification, it should be understood that the terms such as "include" or "have" are merely intended to indicate that features, numbers, steps, operations, components, parts, or combinations thereof are present, and are not intended to exclude a possibility that one or more other features, numbers, steps, operations, components, parts, or combinations thereof will be present or added.

Unless differently defined, all terms used here including technical or scientific terms have the same meanings as the terms generally understood by those skilled in the art to which the present invention pertains. The terms identical to those defined in generally used dictionaries should be interpreted as having meanings identical to contextual meanings of the related art, and are not interpreted as being ideal or excessively formal meanings unless they are definitely defined in the present specification.

Embodiments of the present invention will be described in detail with reference to the accompanying drawings. In the following description of the present invention, the same reference numerals are used to designate the same or similar elements throughout the drawings and repeated descriptions of the same components will be omitted.

In a system that uses a digital circuit, an analog circuit, and an RF circuit, a Power Distribution Network (PDN) is used to supply power required to operate the parts of the circuits. In the PDN, a patch structure connected to a power layer or a ground layer through a via faces the power layer or the ground layer with a dielectric layer interposed between the patch structure and the power layer or the ground layer.

In a patch connected to the power layer or the ground layer through a via, capacitance and inductance are formed due to the structure of the patch, and thus LC resonance is realized. Further, an electromagnetic bandgap structure according to an embodiment of the present invention is periodically arranged, and thus an electromagnetic bandgap structure is ultimately implemented.

FIG. 1 is a view showing the configuration of an electromagnetic bandgap structure according to an embodiment of the present invention.

As shown in FIG. 1, an electromagnetic bandgap structure 100 according to an embodiment of the present invention includes a ground layer 110, a middle layer, and a power layer 150. Here, the middle layer includes a patch 130, which faces the ground layer 110, with a first dielectric layer 120 interposed between the patch 130 and the ground layer 110, wherein the first dielectric layer 120 is stacked on the top of the ground layer 110. Here, the patch 130 may be a metal patch.

Further, the power layer 150 faces the middle layer with a second dielectric layer 140 interposed between the power layer 150 and the middle layer, wherein the second dielectric layer 140 is stacked on the top of the patch 130. The electromagnetic bandgap structure 100 includes a via 160, which is made of a metal material and is capable of electrically connecting the patch 130 of the middle layer to the power layer 150.

The power layer 150 may be a shape in which multiple fan-shaped regions are connected to each other, and each of the fan-shaped regions of the power layer 150 may be formed in a meandering structure. Also, the multiple fan-shaped regions may be formed such that they are connected to each other at a location corresponding to the center of a circle. Here, the center of the circle corresponding to the fan-shaped regions may be disposed at the location identical to that of the center of the power layer 150.

Further, the via 160 may be disposed at the center of the circle corresponding to the fan-shaped regions, and the multiple fan-shaped regions may be connected to each other through the via 160. Furthermore, the via 160 may connect the patch 130 to the power layer 150 in a vertical direction, and the patch 130 and the power layer 150 may be electrically connected to each other through the via 160.

Although a single patch 130 is illustrated as being formed in the middle layer in FIG. 1 for the convenience of description, the present invention is not limited thereto, and the middle layer may include one or more patches 130. In this regard, each patch 130 may be formed in the shape of a rectangle, especially a square, and may be formed such that the center of the patch 130 corresponds to the location of the via 160.

Further, when the middle layer includes multiple patches 130, the multiple patches 130 may be connected to the power layer 150 through the via 160 in a vertical direction. By means of this connection, the power layer 150 and the multiple patches 130 may be electrically connected to each other through the via 160.

Capacitance is formed in the first dielectric layer 120 between the ground layer 110 and each patch 130. Further, inductance is formed in a path of the patch 130 and the power layer 150, which are electrically connected to each other through the via 160. By means of this, an LC resonance circuit is implemented, and thus an electromagnetic bandgap structure capable of suppressing surface current in a specific frequency band may be formed.

Furthermore, the resonance suppression frequency and resonance suppression band of the electromagnetic bandgap structure may be determined by adjusting the magnitude of the capacitance between the power layer and the patch or between the ground layer and the patch, or by adjusting the magnitude of the inductance formed in the path of the power layer-via-patch.

Figure 2:
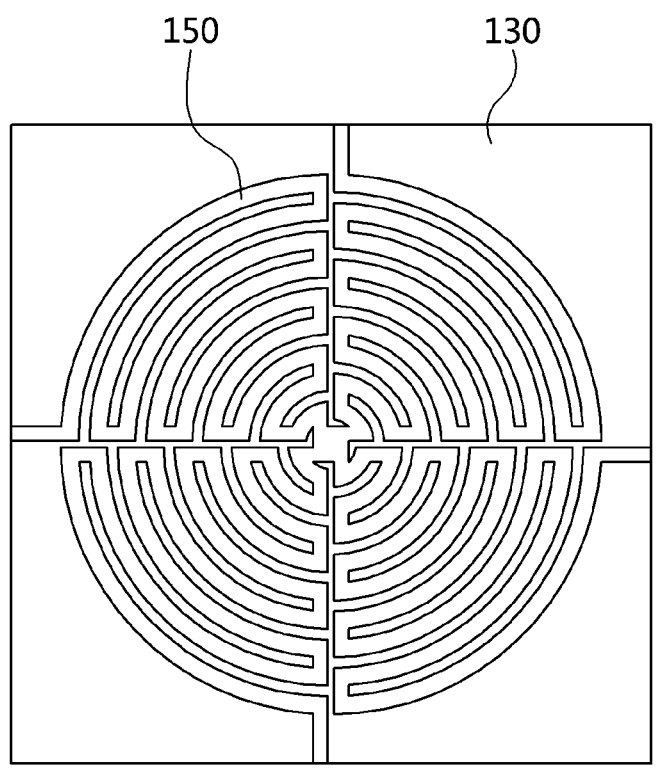
FIG. 2 is a plan view of an electromagnetic bandgap structure according to an embodiment of the present invention.

FIG. 2 is a plan view of the electromagnetic bandgap structure according to an embodiment of the present invention.

As shown in FIG. 2, the patch 130 of the electromagnetic bandgap structure 100 may be formed in the shape of a rectangle, especially a square. Further, a power layer 150 faces the patch 130, with a second dielectric layer 140 interposed between the power layer 150 and the patch 130, wherein the second dielectric layer 140 is formed on the top of the patch 130. The power layer 150 may have a shape in which multiple fan-shaped regions are connected to each other. Here, each of the fan-shaped regions may have a shape radially extending from the center of the power layer 150 in the shape of a fan.

Here, the fact that the power layer 150 has the shape in which the fan-shaped regions are connected to each other may mean that the power lines of the power layer 150 are connected to each other in fan shapes. Further, the power layer 150 may be formed in a meandering structure so as to increase the length of the path of the power lines.

In particular, when the number of fan-shaped regions is 4, the power layer 150 may be formed, as shown in FIG. 2. The center of a circle corresponding to the four fan-shaped regions may be the location of the via 160. Further, the four fan-shaped regions may be connected to each other at the center of the circle, which corresponds to the location of the via 160.

Further, as shown in FIG. 2, each of the four fan-shaped regions may be arranged such that a central angle thereof faces a direction corresponding to the vertex of the patch 130. For example, when the vertices of the patch 130 are formed at the 1:30 position, the 4:30 position, the 7:30 position, and the 10:30 position, as shown in FIG. 2, four respective fan-shaped regions may be arranged such that the central angles thereof face the directions towards the 1:30 position, the 4:30 position, the 7:30 position, and the 10:30 position, respectively.

Here, the magnitudes of respective central angles of the four fan-shaped regions may be identical, and the shapes and sizes of the fan-shaped regions may be identical. Further, each of the fan-shaped regions may be formed in the structure of equally-spaced meandering lines.

As shown in FIG. 2, in the fan-shaped region, the central angle of which faces a direction towards the 1:30 position, a power line may be arranged along the direction from the 3:00 position to the 12:00 position, may be linearly arranged along the direction towards the 12:00 position by a preset length, and may be arranged along the direction from the 12:00 position to the 3:00 position. Then, the power line may be linearly arranged along the direction towards the 3:00 position by a preset length. Thereafter, the above procedure is repeatedly performed, and consequently, a fan-shaped region having a meandering structure may be formed.

Here, the preset length may be set to the same value for the fan-shaped regions of the power layer 150, and thus the power line may be arranged in the structure of equally-spaced meandering lines using the same value.

Respective fan-shaped regions may be formed such that power lines are arranged in the shapes of fans having the same radius. Here, the radius may be a value less than ½ of the length of the side of the patch 130.

Also, respective fan-shaped regions may be formed such that, after the power lines are arranged in meandering structures by the length of the radius, they are arranged lengthwise along the directions towards the 12:00 position, the 3:00 position, the 6:00 position, and the 9:00 position, as shown in FIG. 2.

In this case, the end portions of the fan-shaped power lines, arranged lengthwise along the directions towards the 12:00 position, the 3:00 position, the 6:00 position, and the 9:00 position, may be connected to other electromagnetic bandgap structures in an array structure of electromagnetic bandgap structures. An array structure having a plurality of electromagnetic bandgap structures as respective unit cells will be described in greater detail with reference to FIG. 4, which will be described later.

Figure 3:
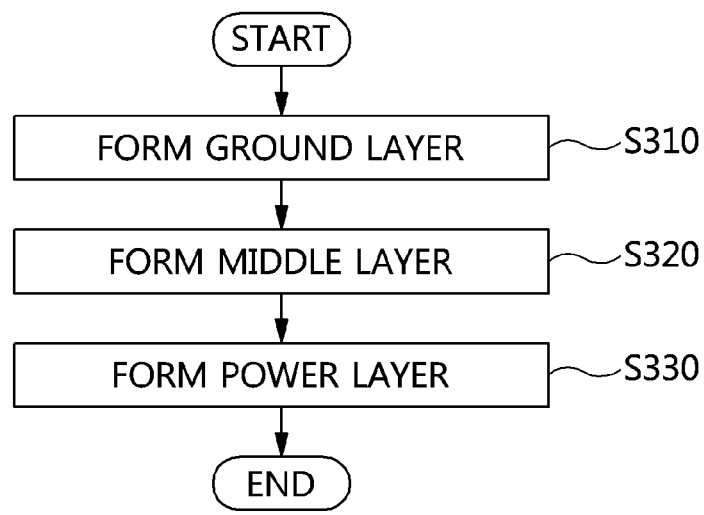
FIG. 3 is a flowchart for explaining a method for manufacturing an electromagnetic bandgap structure according to an embodiment of the present invention.

FIG. 3 is a flowchart for explaining a method for manufacturing an electromagnetic bandgap structure according to an embodiment of the present invention.

As shown in FIG. 3, the electromagnetic bandgap structure 100 according to the embodiment of the present invention is manufactured by performing the step S310 of forming a ground layer, the step S320 of forming a middle layer, and the step S330 of forming a power layer.

At step S320, the middle layer is formed to face the ground layer with a first dielectric layer interposed between the middle layer and the ground layer, wherein the first dielectric layer is stacked on the top of the ground layer. Further, the middle layer includes one or more patches, which are formed to be stacked on the first dielectric layer.

Here, each patch may be a metal patch, and is electrically connected to the power layer through a via. Further, the patch may be formed in the shape of a rectangle, especially a square.

As the middle layer is formed at step S320, capacitance is formed between the ground layer and the patch. Here, the magnitude of the capacitance may be determined to be in proportion to the areas of the ground layer and the patch, which are metal plates facing each other, and to the dielectric constant of a dielectric material contained in the first dielectric layer, and in inverse proportion to an interval between the ground layer and the patch.

A second dielectric layer is stacked on the top of the patch, and the power layer is formed to be stacked on the top of the second dielectric layer at step S330. Here, the via electrically connects the patch stacked on the top of the first dielectric layer to the power layer stacked on the top of the second dielectric layer. Further, inductance is formed along the path of the power layer, the via, and the patch.

Hereinafter, an array structure of electromagnetic bandgap structures according to an embodiment of the present invention will be described in detail with reference to FIG. 4.

Figure 4:
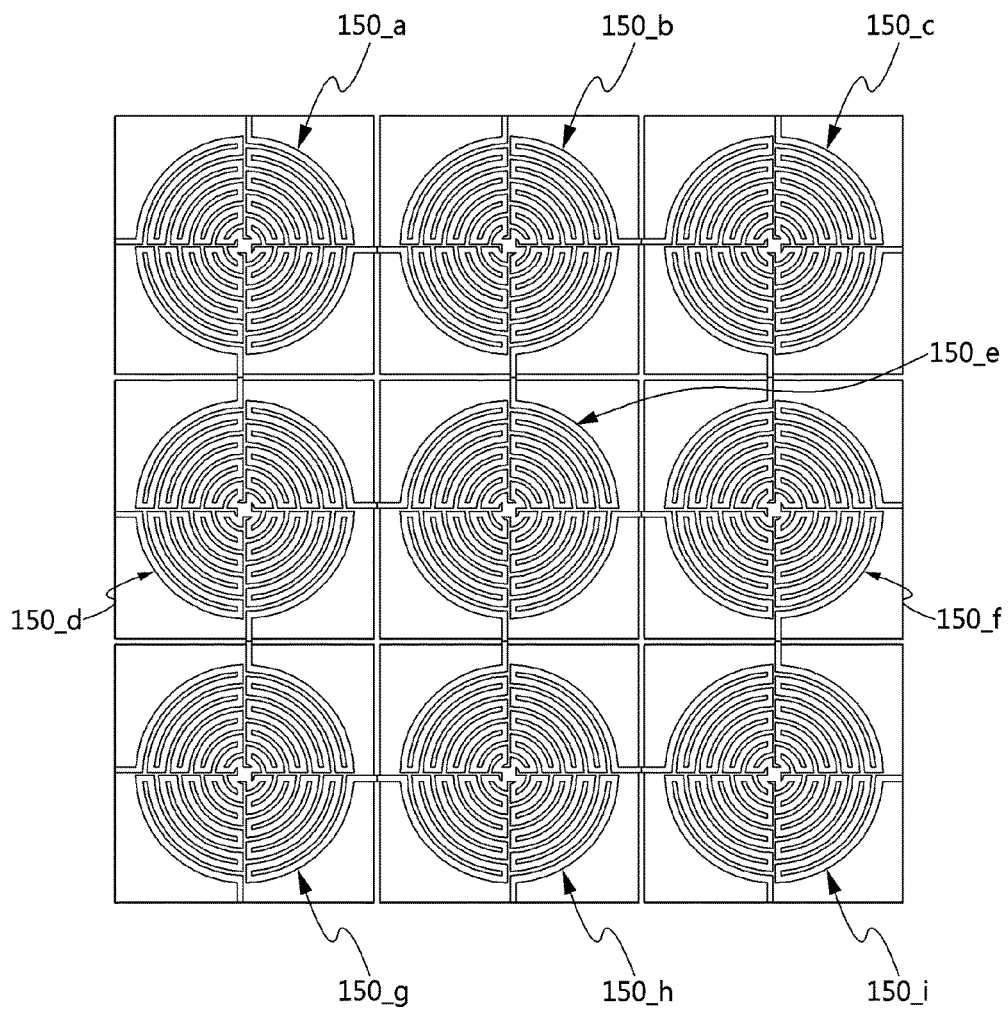
FIG. 4 is a plan view showing an array structure of electromagnetic bandgap structures according to an embodiment of the present invention.

FIG. 4 is a plan view showing an array structure of electromagnetic bandgap structures according to an embodiment of the present invention.

As shown in FIG. 4, the array structure of electromagnetic bandgap structures may be arranged such that the electromagnetic bandgap structure 100 of FIG. 1 is set to a unit cell, and such that end portions of respective fan-shaped power lines are connected to each other.

In the electromagnetic bandgap structures formed on a power-ground plane, periodic patterns must be basically formed. Therefore, the electromagnetic bandgap structure 100 of FIG. 1 is defined as a basic cell, and periodic patterns may be implemented, as shown in FIG. 4.

FIG. 4 illustrates a 3×3 array structure of electromagnetic bandgap structures. For the convenience of description, although the array structure of electromagnetic bandgap structures is described as being a 3×3 array structure, the present invention is not limited to this example, and may be implemented in various arrays by modifying the design of the invention.

In this way, since periodic LC resonance circuits are implemented, very high impedance may be realized in a specific frequency band. By means of this impedance, the flow of surface current propagated through the conductive surface of a conductor is suppressed, with the result that an electromagnetic bandgap (EBG) may be implemented.

In this case, since the power layer in which multiple fan-shaped regions having the meandering structure shown in FIG. 1 are connected to each other may increase an effective wavelength in an effective space, a slow wave may be implemented even at a small size, and the resonance suppression start frequency may be set to that of a low frequency band. Also, since the size of a unit cell may be further reduced, the resonance suppression band may be implemented as a broad band while the resonance suppression start frequency is decreased.

Below, the noise-attenuation characteristics of the electromagnetic bandgap structure according to an embodiment of the present invention will be described in detail with reference to FIG. 5.

Figure 5:
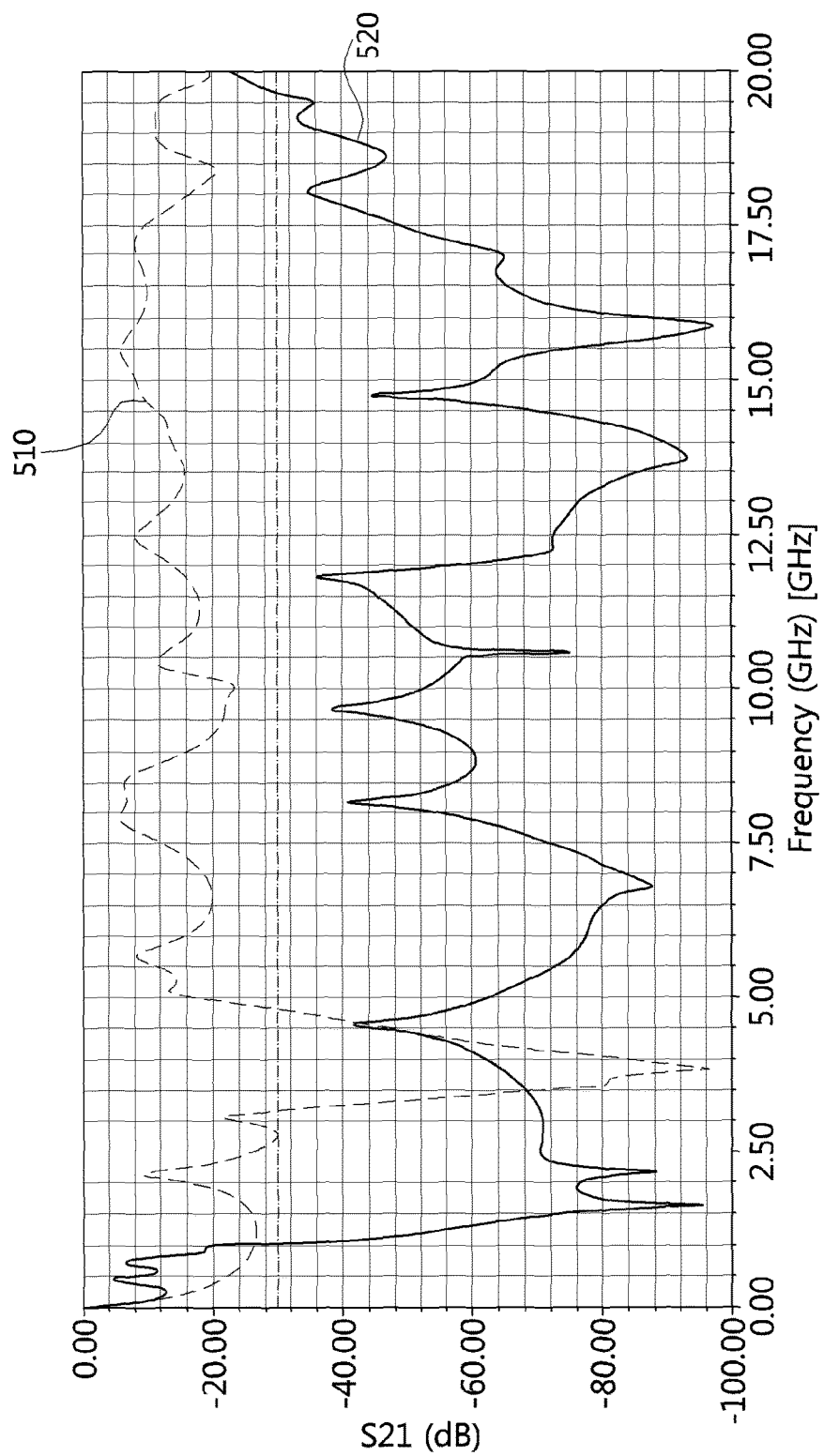
FIG. 5 is a diagram showing the results of simulation of noise attenuation characteristics of the electromagnetic bandgap structure according to an embodiment of the present invention.

FIG. 5 is a diagram showing the results of simulation of the noise-attenuation characteristics of the electromagnetic bandgap structure according to an embodiment of the present invention.

The electromagnetic bandgap structures used in the simulation of the noise-attenuation characteristics include the electromagnetic bandgap structure 100 according to the embodiment of the present invention and a mushroom-like electromagnetic bandgap structure according to conventional technology, and simulation has been conducted using a 3×3 array structure of electromagnetic bandgap structures. Here, the mushroom-like electromagnetic bandgap structure is an electromagnetic bandgap proposed at UCLA in 1999.

The sizes of unit cells of the electromagnetic bandgap structure 100 according to the embodiment of the present invention and the conventional electromagnetic bandgap structure are identical to each other, and the materials of dielectric layers are identical to each other. The width of the unit cells of the electromagnetic bandgap structures used for simulation is 7 mm, the width of a patch is 6.9 mm, the height of a first dielectric layer is 0.1 mm, the material of the first dielectric layer is FR-4, the height of a second dielectric layer is 0.1 mm, the material of the second dielectric layer is FR-4, and the diameter of a via is 0.3 mm.

As a result of the simulation, the noise attenuation characteristics 510 of the conventional electromagnetic bandgap structure and the noise attenuation characteristics 520 of the electromagnetic bandgap structure according to the present invention are illustrated in FIG. 5. In FIG. 5, an x axis indicates frequency and a y axis indicates insertion loss S21.

As shown in FIG. 5, the electromagnetic bandgap structure 100 according to the embodiment of the present invention may effectively form a broadband noise cancellation bandwidth compared to the conventional mushroom-like electromagnetic bandgap structure.

Further, as shown in FIG. 5, the electromagnetic bandgap structure 100 according to the embodiment of the present invention may decrease a noise cancellation start frequency by about 2 GHz or more from that of the conventional technology.

That is, the electromagnetic bandgap structure according to the embodiment of the present invention may implement broadband resonance suppression and may set a resonance suppression start frequency to a low frequency, compared to conventional technology. Owing to these characteristics, the electromagnetic bandgap structure according to the embodiment of the present invention may be implemented to have a small size, and may remarkably improve the reliability of a system in which a digital signal, an analog signal, and an RF signal coexist. Furthermore, the competitiveness of products may be enhanced by implementing small-sized products.

In accordance with the present invention, there can be provided an electromagnetic bandgap structure, which satisfies the characteristics of a low resonance suppression start frequency and broadband resonance suppression so as to suppress broadband simultaneous switching noise on a power plane and a ground plane.

Further, in accordance with the present invention, a system, in which a digital signal, an analog signal, and an RF signal coexist, can be implemented as a small-sized system.

Furthermore, in accordance with the present invention, a system can be stably operated by cancelling power-ground noise in a broadband range.

In addition, in accordance with the present invention, there can be provided an electromagnetic bandgap structure, which can be applied to a multimedia device in which broadband SSN occurs by overcoming the limitation of a conventional mushroom-like electromagnetic bandgap structure, the noise cancellation frequency band of which is narrow.

As described above, in the electromagnetic bandgap structure and the method for manufacturing the structure according to the present invention, the configurations and schemes in the above-described embodiments are not limitedly applied, and some or all of the above embodiments can be selectively combined and configured so that various modifications are possible.

What is claimed is:

1. An electromagnetic bandgap structure, comprising:
    a ground layer;
    a middle layer configured to include one or more patches, and to face the ground layer with a first dielectric layer interposed between the middle layer and the ground layer, wherein the first dielectric layer is stacked on a top of the ground layer; and
    a power layer comprising multiple defined regions and configured to face the middle layer with a second dielectric layer interposed between the power layer and the middle layer,
    wherein the second dielectric layer is stacked on a top of the one or more patches,
    wherein the one or more patches and the power layer are electrically connected to each other through a via,
    wherein the multiple defined regions are spaced apart from each other, and
    wherein each of the multiple defined regions respectively includes a meandering power line coupled to the via, and
    wherein each of the multiple defined regions is arranged such that a central angle thereof faces a direction corresponding to a vertex of each patch.

2. The electromagnetic bandgap structure of claim 1, wherein the power layer is formed in a shape in which the multiple defined regions are connected to each other, with the multiple defined regions being respective fan-shaped regions, to form multiple fan-shaped regions.

3. The electromagnetic bandgap structure of claim 2, wherein each of the multiple fan-shaped regions of the power layer has a meandering structure.

4. The electromagnetic bandgap structure of claim 3, wherein the multiple fan-shaped regions are configured such that a location of the via is a center of a circle corresponding to the multiple fan-shaped regions.

5. The electromagnetic bandgap structure of claim 4, wherein the multiple fan-shaped regions are connected to each other at the center of the circle corresponding to the multiple fan-shaped regions.

6. The electromagnetic bandgap structure of claim 1, wherein the via is configured to connect the one or more patches to the power layer in a vertical direction.

7. The electromagnetic bandgap structure of claim 1, wherein:
    the one or more patches are each formed in a shape of a rectangle, and
    a center of the one or more patches corresponds to a location of the via.

8. The electromagnetic bandgap structure of claim 7, wherein the power layer is formed such that four fan-shaped regions are connected to each other at a center of a circle corresponding to the fan-shaped regions.

9. A method for manufacturing an electromagnetic bandgap structure, the method comprising:
    forming a ground layer;
    forming a middle layer including one or more patches such that the middle layer faces the ground layer with a first dielectric layer interposed between the middle layer and the ground layer, wherein the first dielectric layer is stacked on a top of the ground layer;
    forming a power layer such that the power layer faces the middle layer with a second dielectric layer interposed between the power layer and the middle layer, wherein the second dielectric layer is stacked on a top of the one or more patches; and
    forming a via for electrically connecting the one or more patches to the power layer,
    wherein the power layer includes multiple defined regions that are spaced apart from each other,
    wherein each of the multiple defined regions respectively includes a meandering power line coupled to the via, and wherein each of the multiple defined regions is arranged such that a central angle thereof faces a direction corresponding to a vertex of each patch.

10. The method of claim 9, wherein the power layer is formed in a shape in which the multiple defined regions are connected to each other, with the multiple defined regions being respective fan-shaped regions, to form multiple fan-shaped regions.

11. The method of claim 10, wherein each of the multiple fan-shaped regions of the power layer has a meandering structure.

12. The method of claim 11, wherein the multiple fan-shaped regions are configured such that a location of the via is a center of a circle corresponding to the multiple fan-shaped regions.

13. The method of claim 12, wherein the multiple fan-shaped regions are connected to each other at the center of the circle corresponding to the multiple fan-shaped regions.

14. The method of claim 9, wherein the via is configured to connect the one or more patches to the power layer in a vertical direction.

15. The method of claim 9, wherein:
the one or more patches are each formed in a shape of a rectangle, and
a center of the one or more patches corresponds to a location of the via.

16. The method of claim 15, wherein the power layer is formed such that four fan-shaped regions are connected to each other at a center of a circle corresponding to the fan-shaped regions.

17. An electromagnetic bandgap structure, comprising:
a ground layer;
a middle layer configured to include one or more patches, and to face the ground layer with a first dielectric layer interposed between the middle layer and the ground layer, wherein the first dielectric layer is stacked on a top of the ground layer; and
a power layer configured to face the middle layer with a second dielectric layer interposed between the power layer and the middle layer,
wherein the one or more patches and the power layer are electrically connected to each other through a via,
wherein the power layer is formed such that four fan-shaped regions are connected to each other at a center of a circle corresponding to the fan-shaped regions, and
wherein each of the fan-shaped regions is arranged such that a central angle thereof faces a direction corresponding to a vertex of each patch.

* * * * *